United States Patent
Zhong et al.

(10) Patent No.: US 9,024,435 B2
(45) Date of Patent: May 5, 2015

(54) SEMICONDUCTOR DEVICE, FORMATION METHOD THEREOF, AND PACKAGE STRUCTURE

(75) Inventors: Huicai Zhong, San Jose, CA (US); Qingqing Liang, Lagrangeville, NY (US); Jiang Yan, Newburgh, NY (US); Chao Zhao, Kessel-lo (BE)

(73) Assignee: Institute of Microelectronics, Chinese Academy of Sciences, Beijing, P.R. (CN)

( * ) Notice: Subject to any disclaimer, the term of this patent is extended or adjusted under 35 U.S.C. 154(b) by 22 days.

(21) Appl. No.: 13/379,347

(22) PCT Filed: Aug. 12, 2011

(86) PCT No.: PCT/CN2011/078325
§ 371 (c)(1),
(2), (4) Date: Sep. 6, 2012

(87) PCT Pub. No.: WO2012/149706
PCT Pub. Date: Aug. 11, 2012

(65) Prior Publication Data
US 2013/0020618 A1    Jan. 24, 2013

(30) Foreign Application Priority Data
Apr. 30, 2011   (CN) .......................... 2011 1 0112565

(51) Int. Cl.
*H01L 23/34*   (2006.01)
*H01L 23/522*   (2006.01)
*H01L 23/467*   (2006.01)
*H01L 23/473*   (2006.01)

(52) U.S. Cl.
CPC ............ *H01L 23/522* (2013.01); *H01L 23/467* (2013.01); *H01L 23/473* (2013.01); *H01L 2924/0002* (2013.01)

(58) Field of Classification Search
USPC .......... 257/E21.328, 706, 712, 713, 716, 717, 257/522, E23.099
See application file for complete search history.

(56) References Cited

U.S. PATENT DOCUMENTS

| 7,049,682 | B1 | 5/2006 | Mathews et al. |
| 7,749,786 | B2 * | 7/2010 | Wells .............................. 438/44 |
| 7,823,403 | B2 * | 11/2010 | Sapir ............................ 62/259.2 |
| 2010/0136800 | A1 * | 6/2010 | Kumar et al. ................. 438/795 |

FOREIGN PATENT DOCUMENTS

JP    2000294705 A    10/2000

OTHER PUBLICATIONS

Int'l Search Report.
Written Opinion.

* cited by examiner

*Primary Examiner* — Michael Shingleton
(74) *Attorney, Agent, or Firm* — Goodwin Procter LLP

(57) ABSTRACT

A semiconductor device, a formation method thereof, and a package structure are provided. The semiconductor device comprises: a semiconductor substrate in which a metal-oxide-semiconductor field-effect transistor (MOSFET) is formed; a dielectric layer, provided on the semiconductor substrate and covering the MOSFET, wherein a plurality of interconnection structures are formed in the dielectric layer; and at least one heat dissipation path, embedded in the dielectric layer between the interconnection structures, for liquid or gas to circulate in the heat dissipation path, wherein openings of the heat dissipation path are exposed on the surface of the dielectric layer. The present invention can improve heat dissipation efficiency, and prevent chips from overheating.

5 Claims, 3 Drawing Sheets

SEMICONDUCTOR DEVICE, FORMATION METHOD THEREOF, AND PACKAGE STRUCTURE

This application is a National Phase application of, and claims priority to, PCT Application No. PCT/CN2011/078325, filed on Aug. 12, 2011, entitled "SEMICONDUCTOR DEVICE, FORMATION METHOD THEREOF, AND PACKAGE STRUCTURE," which claimed priority to Chinese Application No. 201110112565.5, filed on Apr. 30, 2011. Both the PCT application and Chinese application are incorporated herein by reference in their entireties.

FIELD OF THE INVENTION

The present invention relates to the field of semiconductor technology, and in particular to a semiconductor device, a formation method thereof, and a package structure.

BACKGROUND OF THE INVENTION

With the continuous development of semiconductor technology, the critical dimension (CD) of semiconductor devices such as Metal-Oxide-Semiconductor (MOS) transistors has become increasingly smaller, and chips have become more highly integrated, resulting in more devices on a single chip. Some high-performance products, e.g., CPU, may even have more than a billion integrated devices. With such a high level of integration, a large amount of heat will be generated in the operation of the chip, and the resulting temperature rise may affect the performance of the chip.

Heat dissipation is difficult in chips that are highly integrated. The problem is even worse for high level technology node where copper interconnects and low dielectric constant (low-K) dielectrics are widely used, because low-K dielectrics have low thermal conductivity.

In the prior art, a common heat dissipation method comprises adding a heat sink, a fan or the like to the package, when the chip has been packaged, but this method performs poorly with chips that are highly integrated, and if a chip is used for long hours, it may still be damaged by heat.

SUMMARY OF THE INVENTION

An object of the present invention is to provide a semiconductor device, a formation method thereof, and a package structure, to improve heat dissipation efficiency.

In order to solve the problems above, the present invention provides a semiconductor device, comprising:
a semiconductor substrate in which a metal-oxide-semiconductor field-effect transistor (MOSFET) is formed;
a dielectric layer, provided on the semiconductor substrate and covering the MOSFET, wherein a plurality of interconnection structures are formed in the dielectric layer; and
at least one heat dissipation path, embedded in the dielectric layer between the interconnection structures, for liquid or gas to circulate in the heat dissipation path, wherein openings of the heat dissipation path are exposed on the surface of the dielectric layer.

Optionally, the heat dissipation path comprises a plurality of interconnected trenches embedded in the dielectric layer between the interconnection structures.

Optionally, the heat dissipation path further comprises a micro heat dissipation pipe provided in the trenches, and the micro heat dissipation pipe is adapted for liquid or gas to circulate therein.

Optionally, the micro heat dissipation pipe is made of a high polymer, an insulating material or a metal nanotube.

Optionally, dielectric materials are filled in the trenches outside the micro heat dissipation pipe.

Optionally, dielectric materials are filled at the openings of the trenches outside the micro heat dissipation pipe so that gaps are formed at bottom of the trenches outside the micro heat dissipation pipe.

Optionally, the dielectric layer has a multi-layered structure, and the interconnection structures are formed in each layer of the multi-layered structure.

The present invention also provides a package structure, comprising: any one of the semiconductor devices above, a package enclosing the semiconductor device, and a circulation pump provided outside the package, wherein the package comprises a first opening and a second opening which are in connection with the heat dissipation path, and the circulation pump drives liquid or gas to circulate through the first opening, the heat dissipation path and the second opening.

The present invention also provides a method for forming a semiconductor device, comprising:
providing a semiconductor substrate in which a metal-oxide-semiconductor field-effect transistor (MOSFET) is formed;
forming a dielectric layer on the semiconductor substrate to cover the MOSFET, wherein a plurality of interconnection structures are formed in the dielectric layer; and
etching the dielectric layer between the interconnection structures to form a heat dissipation path for liquid or gas to circulate therein.

Optionally, the step of etching the dielectric layer between the interconnection structures to form a heat dissipation path comprises the following step: performing anisotropic etching and isotropic etching in the dielectric layer between the interconnection structures to form a plurality of interconnected trenches.

Optionally, after forming a plurality of interconnected trenches, the method further comprises the following step: providing a micro heat dissipation pipe in the interconnected trenches, wherein the micro heat dissipation pipe is adapted for liquid or gas to circulate therein.

Optionally, the micro heat dissipation pipe is made of a high polymer, an insulating material or a metal nanotube.

Optionally, after providing a micro heat dissipation pipe, the method further comprises the following step: filling dielectric materials in the trenches outside the micro heat dissipation pipe.

Optionally, after providing a micro heat dissipation pipe, the method further comprises the following step: filling dielectric materials at openings of the trenches outside the micro heat dissipation pipe, so that gaps are formed at bottom of the trenches outside the micro heat dissipation pipe.

Optionally, the dielectric layer has a multi-layered structure and the interconnection structures are formed in each layer of the multi-layered structure.

In comparison with the prior art, the embodiments of the present invention have the following advantages.

In a semiconductor device and a formation method thereof according to an embodiment of the present invention, a heat dissipation path is formed in the dielectric layer between the interconnection structures, for a liquid or gas to circulate therein. The circulating liquid or gas can absorb heat generated within the semiconductor device in its operation, improving heat dissipation of the chip.

Preferably, in a semiconductor device and a formation method thereof according to an embodiment of the present invention, the heat dissipation path comprises a plurality of interconnected trenches formed in the dielectric layer as well as a micro heat dissipation pipe provided in the trenches, with the liquid or gas circulating in the micro heat dissipation pipe, hence, the performance of the device will not be affected by direct contact between the liquid or gas and the dielectric layer.

Moreover, in a package structure according to an embodiment of the present embodiment, a package comprises a first opening and a second opening in connection with the heat dissipation path, the package structure further comprises a circulation pump provided outside the package, and the circulation pump drives the liquid or gas to circulate through the first opening, the heat dissipation path and the second opening. In this package structure, heat dissipation is performed directly to the interior of the semiconductor device inside the package, hence, heat dissipation efficiency can be improved.

BRIEF DESCRIPTION OF THE DRAWINGS

The above and other objects, features and advantages will become more apparent when read in conjunction with the accompanying drawings, where the same reference numerals denote the same components. The figures are not drawn to scale, in order not to unnecessarily obscure the essence of the present invention.

DETAILED DESCRIPTION OF THE INVENTION

As chips become more highly integrated, heat generated in the operation of a chip has significantly increased, and heat dissipation has become one of the most important problems to be dealt with. In the prior art, a common heat dissipation method comprises adding a heat sink, a fan or the like to the package, when the chip has been packaged. But this method does not deal with the interior of the chip, and therefore has a low heat dissipation efficiency.

In a semiconductor device and a formation method thereof according to an embodiment of the present invention, a heat dissipation path is formed in the dielectric layer between the interconnection structures, for a liquid or gas to circulate therein. The circulating liquid or gas can absorb heat generated within the semiconductor device in its operation, improving heat dissipation of the chip.

Preferably, in a semiconductor device and a formation method thereof according to an embodiment of the present invention, the heat dissipation path comprises a plurality of interconnected trenches formed in the dielectric layer as well as a micro heat dissipation pipe provided in the trenches, with the liquid or gas circulating in the micro heat dissipation pipe, hence, the performance of the device will not be affected by direct contact between the liquid or gas and the dielectric layer.

Moreover, in a package structure according to an embodiment of the present embodiment, a package comprises a first opening and a second opening in connection with the heat dissipation path, the package structure further comprises a circulation pump provided outside the package, and the circulation pump drives the liquid or gas to circulate through the first opening, the heat dissipation path and the second opening. In this package structure, heat dissipation is performed directly to the interior of the semiconductor device inside the package, hence, heat dissipation efficiency can be improved.

For a better understanding of the objects, features and advantages above of the present invention, the embodiments of the present invention will be described in details hereinafter with reference to the accompanying drawings.

In the following description, numerous specific details are set forth; in order to provide a thorough understanding of the present invention. It will be apparent to one skilled in the art that the present invention may be practiced without these specific details, and that equivalents to the present invention may be obtained without deviation from the essence of the present invention. Hence the present invention is not limited to the embodiments disclosed herein.

Figure 1:
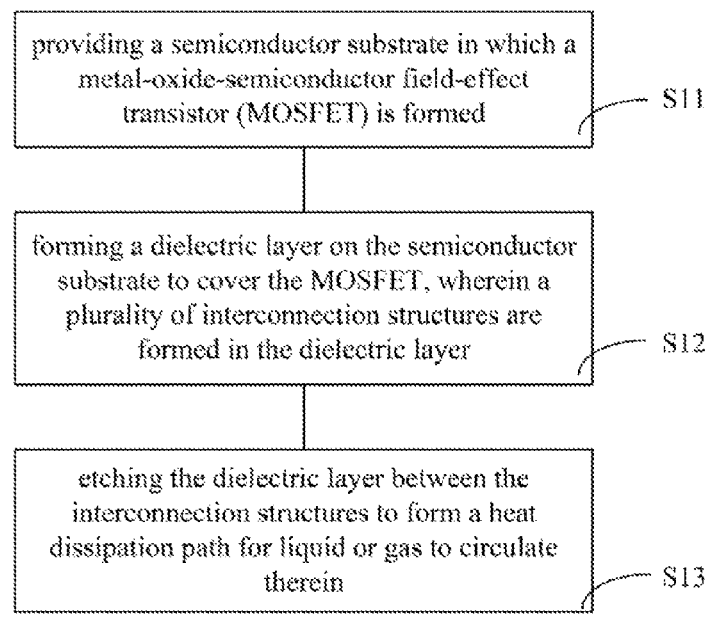
FIG. 1 is a flow chart of a method for forming a semiconductor device according to an embodiment of the present invention.

FIG. 1 is a flow chart of a method for forming a semiconductor device according to an embodiment of the present invention, comprising:

Step 11: providing a semiconductor substrate such that a MOSFET is formed on the semiconductor substrate;

Step 12: forming a dielectric layer on the semiconductor substrate such that the dielectric layer covers the MOSFET, and a plurality of interconnection structures are formed in the dielectric layer; and Step 13: etching the dielectric layer between the interconnection structures so as to form a heat dissipation path, for a liquid or gas to circulate therein.

FIGS. 2 to 7 illustrate a method for forming a semiconductor device according to an embodiment of the present invention with cross-sectional views and top views of an intermediate structure. The embodiment is described in details with reference to FIG. 1 and FIGS. 2 to 7.

Figure 2:
FIGS. 2 to 7 illustrate a method for forming a semiconductor device according to an embodiment of the present invention with cross-sectional views and top views.

As shown in FIG. 1 and FIG. 2, step S11 is preformed: a semiconductor substrate 10 is provided such that a MOSFET is formed on the semiconductor substrate. The semiconductor substrate 10 may be a silicon substrate, a silicon germanium substrate, a group III-V compound substrate, a silicon carbide substrate, or a multi-layered structure thereof. Devices such as MOSFETs (not shown) comprising a source, a drain and a gate may be formed in the semiconductor substrate 10.

Figure 3:
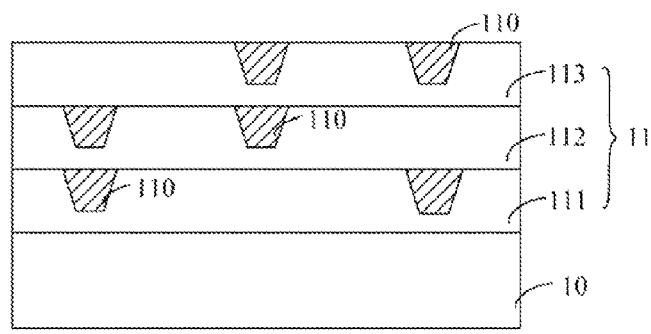

As shown in FIG. 1 and FIG. 3, step S12 is preformed: a dielectric layer 11 is formed on the semiconductor substrate 10 such that the dielectric layer 11 covers the MOSFET, and a plurality of interconnection structures 110 are formed in the dielectric layer 11. Specifically, the dielectric layer 11 in this embodiment may have a multi-layered structure comprising a first dielectric layer 111, a second dielectric layer 112 on the first dielectric layer 111, and a third dielectric layer 113 on the second dielectric layer 112. Interconnection structures 110 may be formed in each of the layers, and the dielectric layers may be made of different materials. The interconnection structure 110 may be a metal interconnection structure, e.g., copper interconnection structure, aluminum interconnection structure, or tungsten interconnection structure, and the first dielectric layer 111 may be a bottom interconnection layer and the third dielectric layer 113 may be a top interconnection layer. As a matter of course, in other embodiments, the dielectric layer 11 may have a multi-layered structure comprising a different number of dielectric films, e.g., five layers, six layers or ten layers, and a pad may be formed in the top layer of the dielectric layers.

For example, in the case of copper interconnects, a method for forming the dielectric layer 11 and the interconnection structures 110 in the dielectric layer 11 may comprise: forming a first dielectric layer 111 on the semiconductor substrate 10 by chemical vapor deposition (CVD) or the like; etching the first dielectric layer 111 to form a trench and/or a through-hole; forming a barrier layer and then a seed layer at the bottom and the sidewall of the trench and/or through-hole, and filling the trench and/or through-hole with metal copper by electroplating or the like; planarizing the filled metal copper to form an interconnection structure 110; and repeating the preceding steps to form a second dielectric layer 112 and an interconnection structure 110 in it, as well as a third dielectric layer 113 and an interconnection structure 110 in it.

Figure 4:
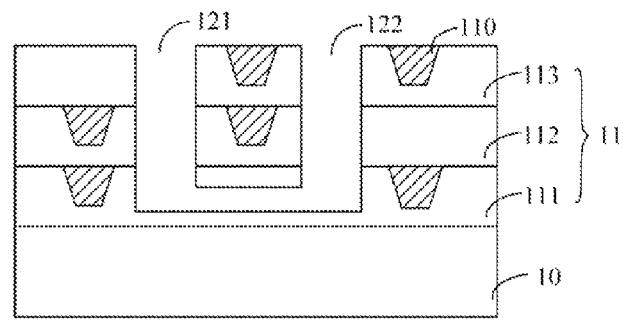
Figure 5:
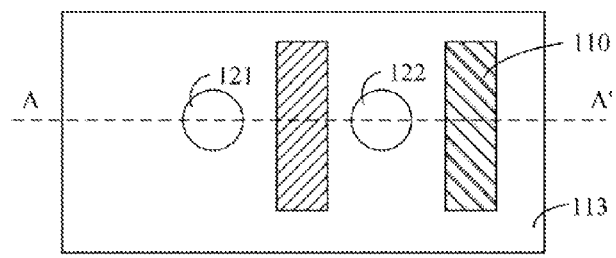

As shown in FIG. 1 and FIGS. 4 to 5, step S13 is preformed: the dielectric layer between the interconnection structures is etched so as to form a heat dissipation path, for a liquid or gas to circulate therein. FIG. 5 is a top view, and FIG. 4 is a section A-A' of FIG. 5. The etching comprises anisotropic etching and isotropic etching. Specifically, firstly, anisotropic etching, e.g., dry etching, is performed on the dielectric layer 11 in the vertical direction, to form trenches 121 and 122 in the dielectric layer 11 between the interconnection structures 110. During this etching process, the interconnection structures 110 should be avoided, and only the dielectric layer between the interconnection structures 110 is etched. Then, isotropic etching, e.g., wet etching, is performed at the bottoms of the vertical trenches 121 and 122, to form a horizontal trench that connects the trenches 121 and 122 at their bottoms. As a matter of course, in other embodiments, the upper portions of the trenches may be formed firstly by anisotropic etching, then isotropic etching is performed to connect the upper portions of the trenches, and then anisotropic etching is performed to form the lower portions of the trenches, i.e., the obtained vertical trenches are connected with each other via a connecting trench connecting their middle parts.

The interconnected trenches 121 and 122 provide a heat dissipation path for the circulation of a liquid or gas. The liquid may be a liquid with less impurity such as deionized water, and the gas may be a non-reactive gas such as nitrogen gas and helium gas. When the semiconductor device is operating, the circulating liquid or gas can take away heat generated within the semiconductor device, improving heat dissipation. In addition, in some embodiments, the trenches 121 and 122 may be unconnected, as long as the circulation of liquid or gas can be realized.

Figure 6:
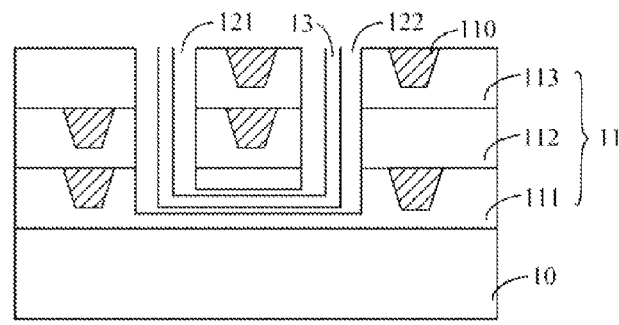

As shown in FIG. 6, as according to a preferred embodiment of the present invention, a micro heat dissipation pipe 13 is provided in the trenches 121 and 122, the micro heat dissipation pipe 13 may be made of a high polymer, an insulating material or a metal nanotube. In this embodiment, the micro heat dissipation pipe 13 is made of a high polymer, and may be formed by self-assembly. The liquid or gas circulates in the micro heat dissipation pipe 13, avoiding direct contact with the dielectric layer 11 at the sidewall of the trenches 121 and 122, thus preventing possible affections on the performance of the semiconductor device.

Figure 7:
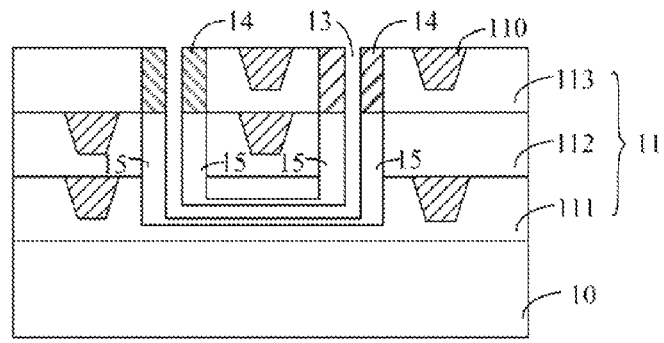

As shown in FIG. 7, a dielectric 14 is filled at the opening of the trenches outside the micro heat dissipation pipe 13, so that gaps 15 are formed at the bottom of the trench outside the micro heat dissipation pipe 13. The dielectric 14 may be silicon oxide, doped silicon glass, a low-K dielectric or the like; and the dielectric 14 may be formed by non-conformal deposition. The gaps 15 may be filled with air, which has a small dielectric constant, good for reducing the resistive-capacitive delay of the whole semiconductor device. Preferably, the dielectric 14 is a low-K dielectric, which can further reduce the resistive-capacitive delay.

In other embodiments, conformal deposition may be used to fill up the trenches outside the micro heat dissipation pipe 13 completely, i.e., no gap left outside the micro heat dissipation pipe 13.

Thus, as shown in FIG. 7, the semiconductor device formed according to an embodiment of the present invention comprises: a semiconductor substrate 10; a dielectric layer 11, provided on the semiconductor substrate 10, wherein a plurality of interconnection structures 110 are formed in the dielectric layer 11; and a heat dissipation path, embedded in the dielectric layer 11 between the interconnection structures 110, for a liquid or gas to circulate in the heat dissipation path, wherein an opening of the heat dissipation path is exposed on the surface of the dielectric layer 11. Preferably, the heat dissipation path comprises a plurality of interconnected trenches and a micro heat dissipation pipe 13 in the trenches, and the trenches outside the micro heat dissipation pipe 13 are filled with a dielectric 14. The trenches may be filled with the dielectric 14 only at their openings, or may be filled up completely. The liquid or gas circulates in the micro heat dissipation pipe 13, to absorb heat generated within the semiconductor device in its operation.

Figure 8:
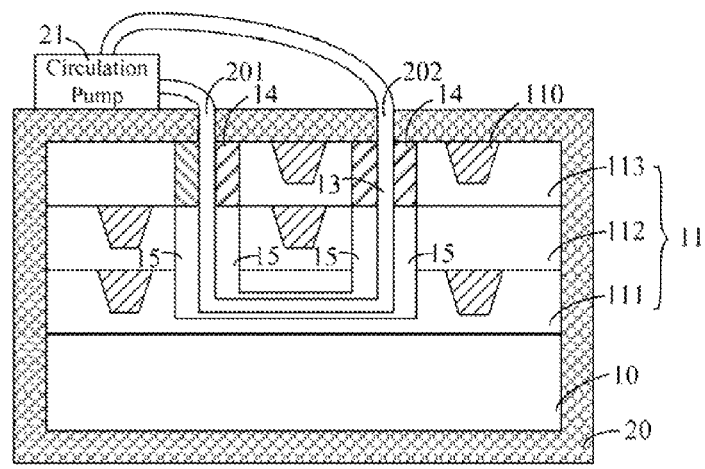
FIG. 8 is a cross-sectional view of a package structure according to an embodiment of the present invention.

FIG. 8 illustrates a package structure according to an embodiment of the present invention. The semiconductor device discussed above is enclosed by a package 20. The to package 20 has a first opening 201 and a second opening 202, and the first opening 201 and the second opening 202 are in connection with the opening of the heat dissipation path, specifically in the present embodiment, in connection with the opening of the micro heat dissipation pipe 13. A circulation pump 21 is provided outside the package 20. The circulation pump 21 drives the liquid or gas to circulate through the first opening 201, the micro heat dissipation pipe 13 and the second opening 202, absorbing heat generated within the semiconductor device.

The package 20 may be made of ceramic, plastic or the like. When the semiconductor device has been packaged in the package 20, through-holes may be formed on the package 20 to, form the first opening 201 and the second opening 202, so that the circulation pump 21 can connect the heat dissipation path via first opening 201 and the second opening 202, improving heat dissipation within the semiconductor device.

Preferred embodiments of the invention are disclosed above, which should not be interpreted as limiting the scope of the invention. Alternations and modifications can be made to the technical solution of the invention by those skilled in the art based on the technical disclosure herein without deviation from the scope of the invention. Therefore, any alternations, equivalents, or modifications made to the embodiments disclosed herein based on the technical essential of the invention without deviation from the scope of the invention should fall within the scope of the invention.

The invention claimed is:
1. A semiconductor device, comprising:
a semiconductor substrate in which a metal-oxide-semiconductor field-effect transistor (MOSFET) is formed;
a dielectric layer, provided on the semiconductor substrate and covering the MOSFET, wherein a plurality of interconnection structures are formed in the dielectric layer; and
at least one heat dissipation path, embedded in the dielectric layer between the interconnection structures, for liquid or gas to circulate in the heat dissipation path, wherein openings of the heat dissipation path are exposed on the surface of the dielectric layer;
wherein the heat dissipation path comprises a plurality of interconnected trenches embedded in the dielectric layer between the interconnection structures and the heat dissipation path further comprises a micro heat dissipation pipe provided in the trenches, and the micro heat dissipation pipe is adapted for liquid or gas to circulate therein;

wherein dielectric materials are filled in the trenches outside the micro heat dissipation pipe.

2. The semiconductor device according to claim 1, wherein the micro heat dissipation pipe is made of a high polymer, an insulating material or a metal nanotube.

3. The semiconductor device according to claim 1, wherein dielectric materials are filled at the openings of the trenches outside the micro heat dissipation pipe so that gaps are formed at bottom of the trenches outside the micro heat dissipation pipe.

4. The semiconductor device according to claim 1, wherein the dielectric layer has a multi-layered structure, and the interconnection structures are formed in each layer of the multi-layered structure.

5. A package structure, comprising: a semiconductor device according to claim 1, a package enclosing the semiconductor device, and a circulation pump provided outside the package, wherein the package comprises a first opening and a second opening which are in connection with the heat dissipation path, and the circulation pump drives liquid or gas to circulate through the first opening, the heat dissipation path and the second opening.

* * * * *